US 6,580,609 B2

(12) United States Patent
Pautsch

(10) Patent No.: US 6,580,609 B2
(45) Date of Patent: Jun. 17, 2003

(54) METHOD AND APPARATUS FOR COOLING ELECTRONIC COMPONENTS

(75) Inventor: Gregory W. Pautsch, Chippewa Falls, WI (US)

(73) Assignee: Cray Inc., Seattle, WA (US)

( * ) Notice: Subject to any disclaimer, the term of this patent is extended or adjusted under 35 U.S.C. 154(b) by 0 days.

(21) Appl. No.: 10/118,279

(22) Filed: Apr. 8, 2002

(65) Prior Publication Data

US 2002/0135981 A1 Sep. 26, 2002

Related U.S. Application Data

(63) Continuation of application No. 09/860,038, filed on May 16, 2001.

(51) Int. Cl.[7] ................................................. H05K 7/20
(52) U.S. Cl. .................. 361/698; 29/890.03; 62/259.2; 165/80.4; 257/714; 361/700
(58) Field of Search .................. 29/890.03; 257/713, 257/714; 165/80.3, 80.4, 104.33, 908; 174/15.1; 454/184; 363/141; 62/64, 259.2; 361/687, 696, 698, 699, 700, 701, 717–719, 722

(56) References Cited

U.S. PATENT DOCUMENTS

| | | | |
|---|---|---|---|
| 4,897,762 A | 1/1990 | Daikoku et al. | 361/382 |
| 5,131,233 A | 7/1992 | Cray et al. | 62/64 |
| 5,220,804 A | 6/1993 | Tilton et al. | 62/64 |
| 5,251,097 A | 10/1993 | Simmons et al. | 361/687 |
| 5,260,850 A | 11/1993 | Sherwood et al. | 361/689 |
| 5,285,347 A | 2/1994 | Fox et al. | 361/385 |
| 5,323,847 A * | 6/1994 | Koizumi et al. | 165/104.33 |
| 5,349,831 A | 9/1994 | Daikoku et al. | 62/376 |
| 5,412,536 A | 5/1995 | Anderson et al. | 361/700 |
| 5,675,473 A | 10/1997 | McDunn et al. | 361/699 |
| 5,731,542 A | 3/1998 | Limper-Brenner et al. | 174/52.4 |

(List continued on next page.)

FOREIGN PATENT DOCUMENTS

| | | | | |
|---|---|---|---|---|
| EP | 0817263 | 1/1998 | | H01L/23/473 |
| WO | WO-01/20962 | 3/2001 | | H05K/7/20 |

OTHER PUBLICATIONS

Antonetti, V., et al., "Bibliography of Heat Transfer in Electronic Equipment", *IEEE Transactions on Components, Hybrids, and Manufacturing Technology*, CHMT—8 (2), pp. 289–295, (Jun. 1985).

Bar–Cohen, A., "Thermal Management of Electronic Components with Dielectric Liquids", *JSME International Journal*, Series B, 36(1), pp. 1–25, (1993).

Bergles, A., *International Symposium on Cooling Technology for Electronic Equipment*, pp. 353–367, (1988).

Chu, R., et al., "Electronic Module Coolability Analysis", *EEP—vol. 19–2, Advances in Electronic Packaging*, 2, pp. 1983–1988, (1997).

(List continued on next page.)

*Primary Examiner*—Gerald Tolin
(74) *Attorney, Agent, or Firm*—Schwegman, Lundberg, Woessner & Kluth, P.A.

(57) ABSTRACT

A system and method for cooling electronic components. A liquid is heated to a temperature near its boiling point and directed against electronic components such that a portion of the heated liquid vaporizes, forming a mixed phase fluid. The mixed phase fluid is drawn away from the electronic components and the vapor is condensed back into a liquid.

28 Claims, 13 Drawing Sheets

U.S. PATENT DOCUMENTS

| | | | |
|---|---|---|---|
| 5,768,103 A | | 6/1998 | Kobrinetz et al. ........... 361/699 |
| 5,823,248 A | | 10/1998 | Kadota et al. .......... 165/104.33 |
| 5,854,092 A | * | 12/1998 | Root et al. ................... 438/106 |
| 5,880,931 A | | 3/1999 | Tilton et al. ................ 361/690 |
| 5,907,473 A | * | 5/1999 | Przilas et al. ............... 361/699 |
| 5,924,482 A | * | 7/1999 | Edwards et al. ........ 165/104.33 |
| 5,943,211 A | * | 8/1999 | Havey et al. ............... 361/699 |
| 5,999,404 A | * | 12/1999 | Hileman ..................... 361/699 |
| 6,060,966 A | * | 5/2000 | Tennant et al. ............. 333/202 |
| 6,061,235 A | | 5/2000 | Cromwell et al. .......... 361/690 |
| 6,104,610 A | | 8/2000 | Tilton et al. ................ 361/699 |
| 6,215,166 B1 | * | 4/2001 | McDunn et al. ............ 257/467 |
| 6,349,554 B2 | | 2/2002 | Patel et al. ................ 62/259.2 |
| 6,366,461 B1 | | 4/2002 | Pautsch et al. ............. 361/690 |
| 6,408,630 B2 | * | 6/2002 | Macias et al. ................ 62/3.7 |

OTHER PUBLICATIONS

Incropera, F., "Convection Heat Transfer in Electronic Equipment Cooling", *Journal of Heat Transfer*, 110, pp. 1097–1111, (Nov. 1988).

Nakayama, W., "Liquid–Cooling of Electronic Equipment: Where Does It Offer Viable Solutions", *EEP—vol. 19–2, Advances in Electronic Packaging*, 2, pp. 2045–2052, (1997).

Pautsch, G., et al., "Thermal Managment of Multichip Modules with Evaporative Spray Cooling", *EEP—vol. 26–2, Advances in Electronic Packaging*, 2, pp. 1453–1461, (1999).

Park, K.A., et al., "Heat Transfer Characteristics of Simulated Microelectronic Chips with Heat Sinks", *Cooling Technology for Electronic Equipment*, Aung, W., ed; Hemisphere Publishing Corporation, ISBN 0–89116–731–5, (1988), 353–367.

* cited by examiner

METHOD AND APPARATUS FOR COOLING ELECTRONIC COMPONENTS

RELATED APPLICATIONS

This patent application is a continuation of pending patent application entitled: SPRAY EVAPORATIVE COOLING SYSTEM AND METHOD, Ser. No. 09/860,038, filed May 16, 2001, and is assigned to a common assignee. This application is incorporated herein by reference in its entirety.

FIELD OF THE INVENTION

The present invention is related to cooling of electronic equipment, and more particularly to cooling electronics components.

BACKGROUND INFORMATION

Demand for higher performance supercomputers continues to create challenging thermal and packaging design environments for today's computer packaging engineers. As the performance of CRAY supercomputers continues to grow exponentially, in general agreement with Moore's law (Bar-Cohen, et al, 1988), the thermal and packaging solutions continue to become more complex.

The increase of supercomputer performance over the last 30 years was initially achieved with an increase in the complexity of the computer's CPU by increasing the number of ICs within a CPU. The next step in performance was achieved by adding more gates per IC along with increasing the clock rate. Performance was further increased by the paralleling of CPUs and then the scaling of groups of CPUs. Now in order to continue on the path of Moore's law, we are again pushing the IC technology and ultimately the performance of each individual CPU.

One technology that hasn't been able to keep pace with the ICs is the printed circuit board (PCB) technology. The demands for component placement and IC net routings have exceeded the current state of the art in PCB technology.

One solution to this problem implements a multi-chip module with thin film routing layers (MCM-D) for the packaging of these high performance chip sets. This high density packaging design is, however, capable of producing heat fluxes on the ICs and MCM that approach values of 50 and 15 $W/cm^2$, respectively. The control of the IC's junction temperature is important for its reliability and for the performance of two communicating devices. The amount of induced leakage "noise" that exists on an integrated circuit is also a function of its temperature.

A number of cooling methodologies have been described by Bar-Cohen (Bar-Cohen, A., "Thermal Management of Electronic Components with Dielectric Liquids", JSME International Journal, Series B, vol. 36, No1,1993), by Simons (Simons, R. E., "Bibliography of Heat Transfer in Electronic Equipment", 1989, IBM Corporation), by Incropera (Incropera, F. P., "Convection Heat Transfer in Electronic Equipment Cooling", Journal of Heat Transfer, Nov. 1988, Vol. 110/1097) and by Bergles (Bergles, A. E., "Liquid Cooling for Electronic Equipment", International Symposium on Cooling Technology for Electronic Equipment, March 1987). Studies by Chu and Chrysler (Chu, R. C., and Chrysler, G. M., "Electronic Module Coolability Analysis", EEP-Vol. 19-2, Advances in Electronic Packaging-1997 Volume 2, ASME 1997) and by Nakayama (Nakayama, W., "Liquid-Cooling of Electronic Equipment: Where Does It Offer Viable Solutions?", EEP-Vol. 19-2, Advances in Electronic Packaging-1997 Volume 2, ASME 1997), however, indicate that these approaches are no longer capable of satisfying todays high density packaging requirements (Chu and Chrysler, 1997), (Nakayama, 1997).

As heat flux continues to increase, the most promising methods are those that utilize direct liquid cooling with dielectric fluids. Direct liquid cooling circumvents the problems of high thermal interface resistance associated with conventional technologies and is capable of providing very high heat transfer rates (Bar-Cohen, 1993). A number of such direct liquid cooling techniques are described in, "Thermal Management of Multichip Modules with Evaporative Spray Cooling," by G. W. Pautsch and A. Bar-Cohen, published in ASME Advances in Electronic Packaging 1999, EEP-Vol.26-2, 1453–1463, the discussion of which is incorporated herein by reference. That paper concluded that the method of choice for cooling high heat flux electronic components is describe as "High Density, Pressure-Atomized Evaporative Spray Cooling". This condition occurs when a fluid is sprayed on a surface at a rate that maintains a continuously wetted surface, whose temperature is less than 25° C. above the saturation temperature of the thermal coolant. This method, with the selection of an appropriate fluid, such as Fluorinert™ FC-72 which has a boiling point of 56° C. at standard atmospheric conditions, allows one to maintain high heat flux components at operating temperatures below 85° C.

Each of the above cooling approaches has its deficiencies. What is needed is a system and method for cooling electronics components that addresses these deficiencies.

SUMMARY OF THE INVENTION

To address the problems stated above, and to solve other problems which will become apparent in reading the specification and claims, a system and method for cooling electronic components is described herein.

In one embodiment, an enclosure is provided which includes a plurality of a first set of electronic components, cooling means for cooling a gas, and distribution means for directing the gas across the electronics components and the cooling means, where the distribution means forms a closed system limiting the transfer of the gas both into and out of the distribution means.

Several options for the enclosure are as follows. For instance, in one option, the cooling means includes a cooling coil and means for directing water through the cooling coil. In another option, the enclosure further includes means for spray evaporative cooling a second set of electronic components. In yet another option, the first set of electronic components are low power components and the second set of electronic components are high power components.

In yet another embodiment, a system includes a chassis including one or more modules with a plurality of electronic components, where the chassis forms a closed system therein. The system further includes a gas distribution member positioned within the chassis, where the gas distribution member is configured to direct a chilled gas toward the electronic components. A gas cooling device is positioned within the chassis, where the gas cooling device is configured to cool the gas after the gas has been heated by the electronic components.

Several options for the system are as follows. For instance, in one option, at least one of the modules includes a mechanical subsystem having multiple electronic modules and at least one fluid conditioning unit, and optionally at least one of the modules includes a spray evaporative cooling assembly. In yet another option, the gas cooling device includes a heat exchanger.

In another embodiment, a system includes a chassis including one or more modules with one or more electronic modules and at least one fluid conditioning unit, where at least one of the electronic modules includes at least one spray evaporative cooling assembly. The system further includes a gas distribution member positioned within the chassis, where the gas distribution member configured to direct a chilled gas toward the electronic components. The system further includes a gas cooling device positioned within the chassis, where the gas cooling device configured to cool the gas after the gas has been heated by the electronic components.

Several options for the system are as follows. For instance, in one option, the at least one spray evaporative cooling assembly and the at least one fluid conditioning unit form a closed system. In another option, the chassis forms a closed system therein. In yet another option, the at least one fluid conditioning unit includes at least one pump and a heat exchanger. The spray evaporative cooling assembly, in another option, includes a fluid charged with a non-corrosive, inert gas, for example Nitrogen.

A method of cooling an electronics enclosure is provided in another embodiment. The method includes forcing air over a first set of electronic components and cooling the first set of electronic components, heating a liquid to a temperature near its boiling point, directing the heated liquid against a second set of electronic components where at least portion of the heated liquid vaporizes, drawing the vapor and the heated liquid away from the electronics components, condensing the vapor back into liquid, and cooling the air and recirculating the air through the enclosure, where the air is maintained within the enclosure in a closed system.

Several options for the method are as follows. For example, in one option, the method further includes recirculating the liquid, where the liquid and vapor are maintained within the enclosure in a closed system. In another option, the method further includes filtering the liquid, or charging the liquid with a non-corrosive gas. In another option, directing the heated liquid against the second set of electronic components includes directing the heated liquid against electronic components having a higher power than the first set of electronic components.

In yet another embodiment, a method of cooling an electronics enclosure having a plurality of electronics components includes directing a gas over electronic components and cooling the first set of electronic components, cooling the gas within the electronics enclosure, and recirculating the gas within the enclosure, where the air is maintained within the enclosure in a closed system.

Several options for the method are as follows. For instance, in one embodiment, cooling the gas includes passing the gas through a water cooled heat exchanger. Optionally, recirculating the gas includes directing the gas up sides of the enclosure to air plenums at the top of the enclosure. The method further optionally includes funneling the gas across heatsinks thermally coupled with the electronic components.

These and other embodiments, aspects, advantages, and features of the present invention will be set forth in part in the description which follows, and in part will become apparent to those skilled in the art by reference to the following description referenced drawings or by practice of the invention. The aspects, advantages, and features of the invention are realized and attained by the system, apparatus, procedures, and combinations particularly pointed out in the appended claims and their equivalents.

BRIEF DESCRIPTION OF THE DRAWINGS

In the following drawings, where the same number reflects similar function in each of the drawings.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

The present embodiments will be described in the context of the SV2 computer manufactured by Cray Inc. of Seattle, Wash. The CRAY® SV2 computer is a highly scalable, cache coherent, shared memory multiprocessor supercomputer using powerful vector processors as its building blocks. The core building block of the system is an eight chip multi-streaming processor (MSP) which is packaged on a multichip module (MCM) and placed on a printed circuit board. Each MCM generates a great deal of heat, and the heat must be transferred away from the MCM.

There are two module types used in the CRAY SV2 system: a node module and a router module. The node module contains the systems' MSPs, its associated memory and communication channels. The router modules are symmetric 8-port crossbars that provide multiple independent interconnection networks for the system.

Figure 1:
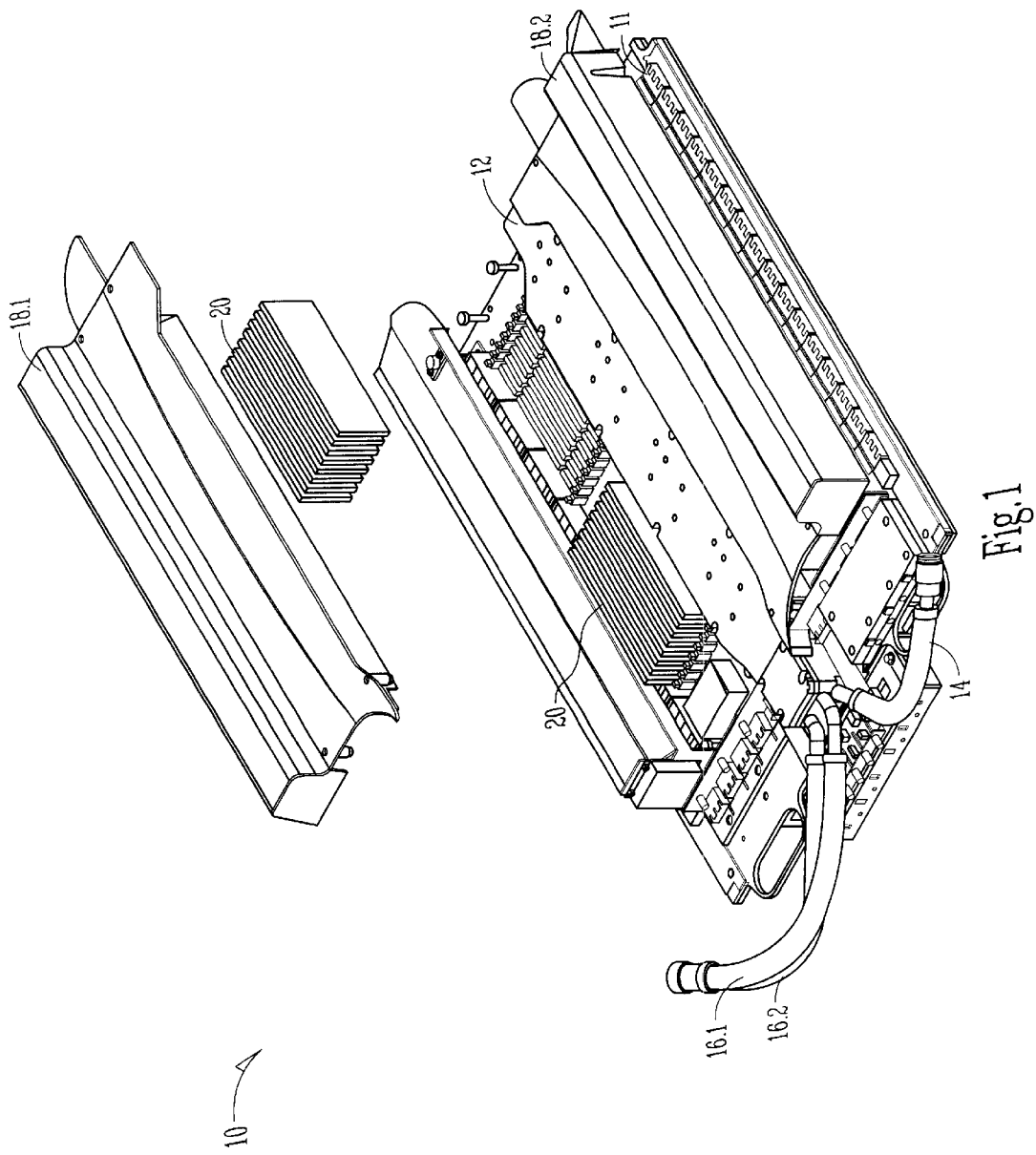
FIG. 1 illustrates a node module constructed in accordance with one embodiment.

A node module 10 suitable for use in a highly dense computer such as the SV2 supercomputer is shown in FIG. 1. In the module 10 of FIG. 1, both air and liquid cooling are used to cool the electronic components within module 10. Each module 10 includes a liquid cooling manifold 12 for carrying an inert coolant such as FC-72. In the embodiment shown, manifold 12 extends across a group of higher power electronic components running down the center of module 10. Other configurations could be used as well.

In the embodiment shown, manifold 12 includes an input hose 14 and two output hoses 16.1 and 16.2. In addition, two air cooling manifolds (18.1 and 18.2) direct air across lower power electronic components (such as daughter cards 20) within module 10. Gases other than air could also be used to cool the lower power electronic components within module 10.

Figure 2:
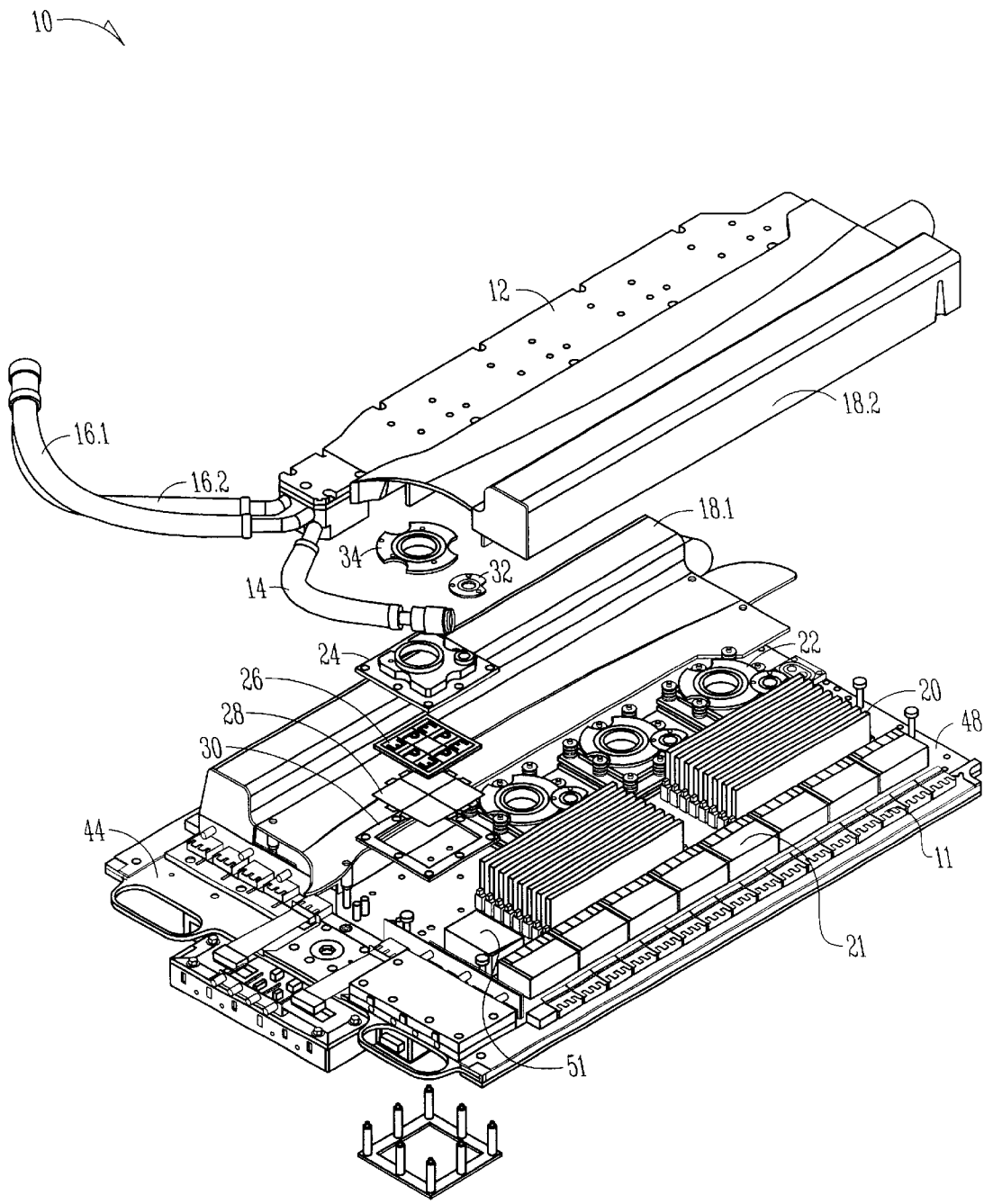
FIG. 2 illustrates a node module constructed in accordance with one embodiment.

An exploded view of module 10 is shown in FIG. 2. In module 10 of FIG. 2, liquid cooling manifold 12 has been disconnected from module 10 to expose MCM modules 22. In the embodiment shown, each module 10 includes four MCM modules 22. Each MCM module 22 includes a spray evaporative cap 24, an MCM 26 and a compliant interconnect 28 held within a compliant interconnect frame 30. In the embodiment shown, manifold 12 includes input adapters 32 and output adapters 34 for injecting and removing liquid, respectively, from MCM module 22.

Figure 3:
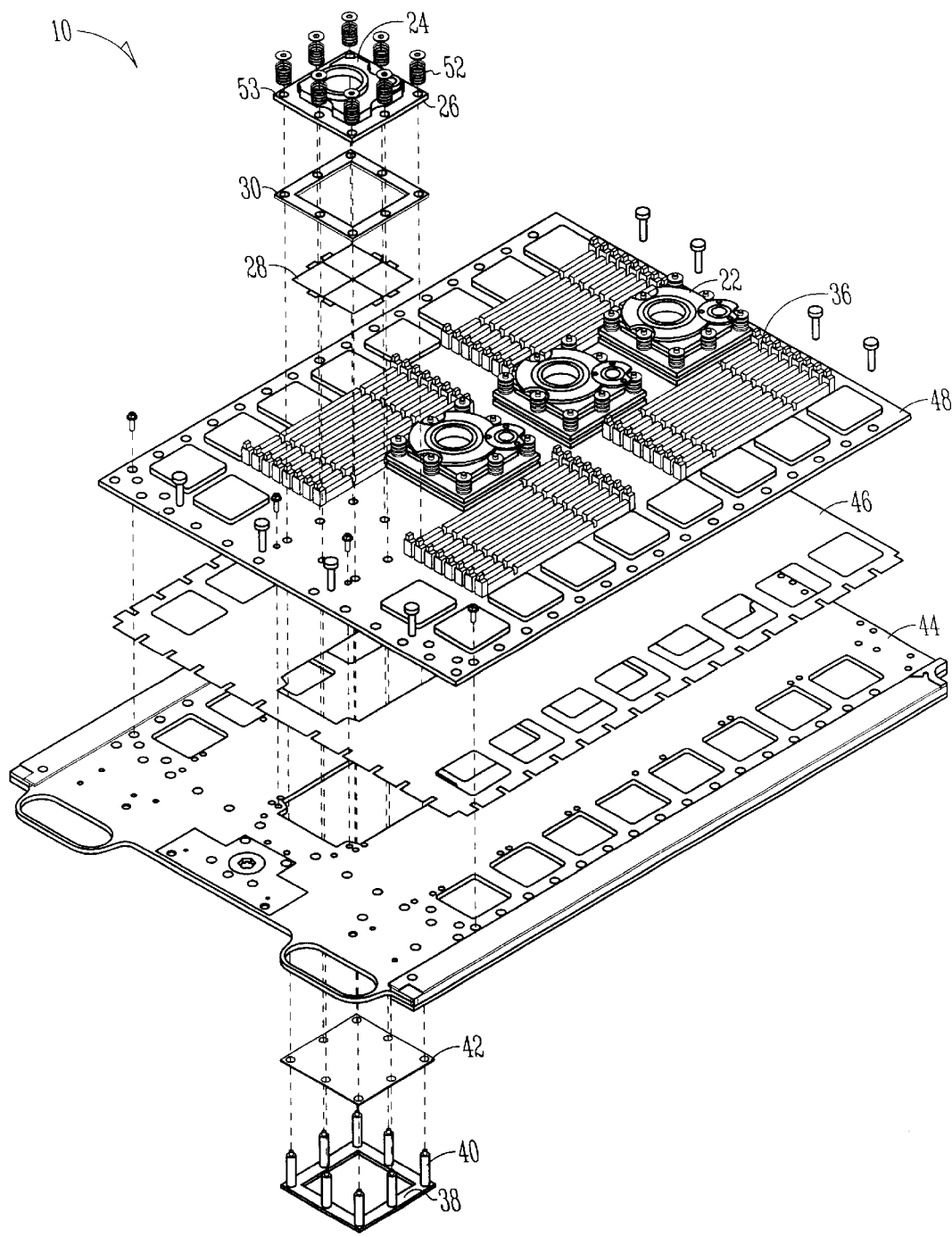
FIG. 3 illustrates a node module constructed in accordance with one embodiment.

An even more exploded view of one embodiment of module 10 is shown in FIG. 3. In the embodiment shown in FIG. 3, each module 10 includes a cold plate 44. Other configurations could be used as well.

In module 10 of FIG. 3, manifolds 12, 18.1, and 18.2 (FIGS. 1 and 2) have been removed from module 10 to expose MCM modules 22 and daughter card connectors 36. In the embodiment shown, each module 10 includes four MCM modules 22. Each MCM module 22 includes a spray evaporative cap 24, an MCM 26, a compliant interconnect 28 and a compliant interconnect frame 30. In the embodiment shown, a backer plate 38 with eight posts 40 is inserted through an insulator 42, a cold plate 44, an insulator 46 and a printed circuit board 48 such that the posts 40 extend beyond printed circuit board 48. Compliant interconnect frame 30 is aligned with and placed over posts 40 such that posts 40 extend through frame 30 and into openings 53 within cap 24.

In one embodiment, tempered steel springs 52 are placed over posts 40 and held in compression using a snap ring locked within a groove on each post 40. In one such embodiment, MCM 26 and cap 24 are assembled together before being placed over posts 40. Springs 52 are then placed over posts 40 and compressed such that a compression of 350 to 400 pounds of pressure is placed on caps 24, securely holding MCM 26 in place. Such an approach ensures the electrical connection between MCM 26 and printed circuit board 48 without the need for flow soldering or other permanent connection.

The CRAY SV2 supercomputer is Cray's first product to use MCM technology. The product design required an 83 layer MCM substrate that was fabricated using glass ceramic and copper conductor construction. Its physical size is 72 mm square and 8.3 mm thick. The MCM substrate is made up of 18 plane pairs of X-Y routing; the balance of the layers are power and ground. The copper signal lines are either 85 or 100μ wide, 20μ thick, and are routed on a 450μ pitch. The impedance of the traces are 55 Ωs.

In one embodiment, there are eight ASICs mounted on each MCM 26 substrate, along with 80 decoupling capacitors. In one such embodiment, these devices are assembled onto the MCM substrate using Controlled Collapse Chip Connections (C4s) such as described in *Microelectronics Packaging Handbook* (Tummala, R. R, Rymaszewski, E. J., Van Nostrand Reinhold Publishing, 1989).

In one embodiment, approximately 34000 C4 pads are placed on the top surface metal layer (TSM) of which approximately 8000 are signal; the remaining are power and ground. These ASICs are approximately 16 or 17 mm square. On the bottom of MCM 26 there are 3832 Land Grid Array (LGA) pads. Approximately half the pads are signal; the remaining are power and ground. These pads are electrically attached to PCB 48 with a compliant interconnect system.

The CRAY SV2 supercomputer employs a custom designed compliant Land Grid Array (LGA) connector system that electrically connects a demateable MCM 26 to the Node module 10's PCB 48. Each LGA connector system is made up of 3832 contacts on a 1 mm pitch. The contacts are divided into four identical quadrants.

In one embodiment, MCM 26 alignment is obtained by the socket insulator spring/fence centering MCM 26 within the socket. In one such embodiment, a unique pattern was established between the signal I/O and the power and ground contacts for reducing crosstalk in the LGA connector system. The quadrant carriers each have an array size of 31 rows square, presenting up to 961 high compliant, non-yielding (0.012 inch travel), low force (40 grams per contact), low contact and bulk resistance (<0.015 milli-ohm at 0.75 amps), low inductance (<1.5 nH at 500–1000 MHz) contacts that connect gold plated pads on the top surface of PCB 48 to gold plated pads on the bottom surface metal (BSM) of MCM 26. The force required for electrical contact between the MCM and the PCB is provided with spring compression hardware that has been integrated into the thermal management's spray evaporative cooling cap as described above. In one embodiment, the cap assembly maintains a normal force of 65 grams per contact. Assembly of the system is facilitated by a custom gang compression and spring removal tool which acts as a collet around the MCM cooling cap assembly.

In one embodiment, PCB 48 is used to connect the MSP processing unit within each of the MCM modules 22 to the memory daughter cards, to other modules, and to the IO channels for front-end communication. To make all of these connections requires 17,000 differential and single ended nets in the PCB. In one embodiment, in order to connect these nets to the components there are 70,000, 0.28 mm diameter plated through holes.

In one embodiment, there are 34 metal layers in PCB 48. Sixteen layers are power/ground layers, 16 paired signal layers, one layer is a TSM and one layer is a BSM. In one such embodiment, each layer pair has approximately 4,000 buried vias which connect the plane pair together to aid in the routing of the signals. The total number of drilled holes in the PCB is approximately 100,000.

In one embodiment, the via grid in PCB 48 is 1 mm, which allows two routes per channel. Board 48, in one option, is 558 mm by 431 mm and is approximately 3.56 mm thick. In another option, the PCB is constructed from an organic material with a Er of approximately 3.4.

In one embodiment, the characteristic impedance of the differential lines are 100 Ωs; the single ended lines are 45 Ωs. The signal lines are 0.076 mm wide and are on 0.18 mm and 0.28 mm pitches.

The CRAY SV2 supercomputer employs synchronous switching DC—DC power converters that operate at approximately 80% efficiency. This converter was designed to meet Cray's specific electrical design requirements and physical form factors. Each DC—DC power converter convert 48 volts DC input power to 1.8 or 2.5 volts DC output power with an output current of 190 amps or 125 amps, respectively.

Figure 4:
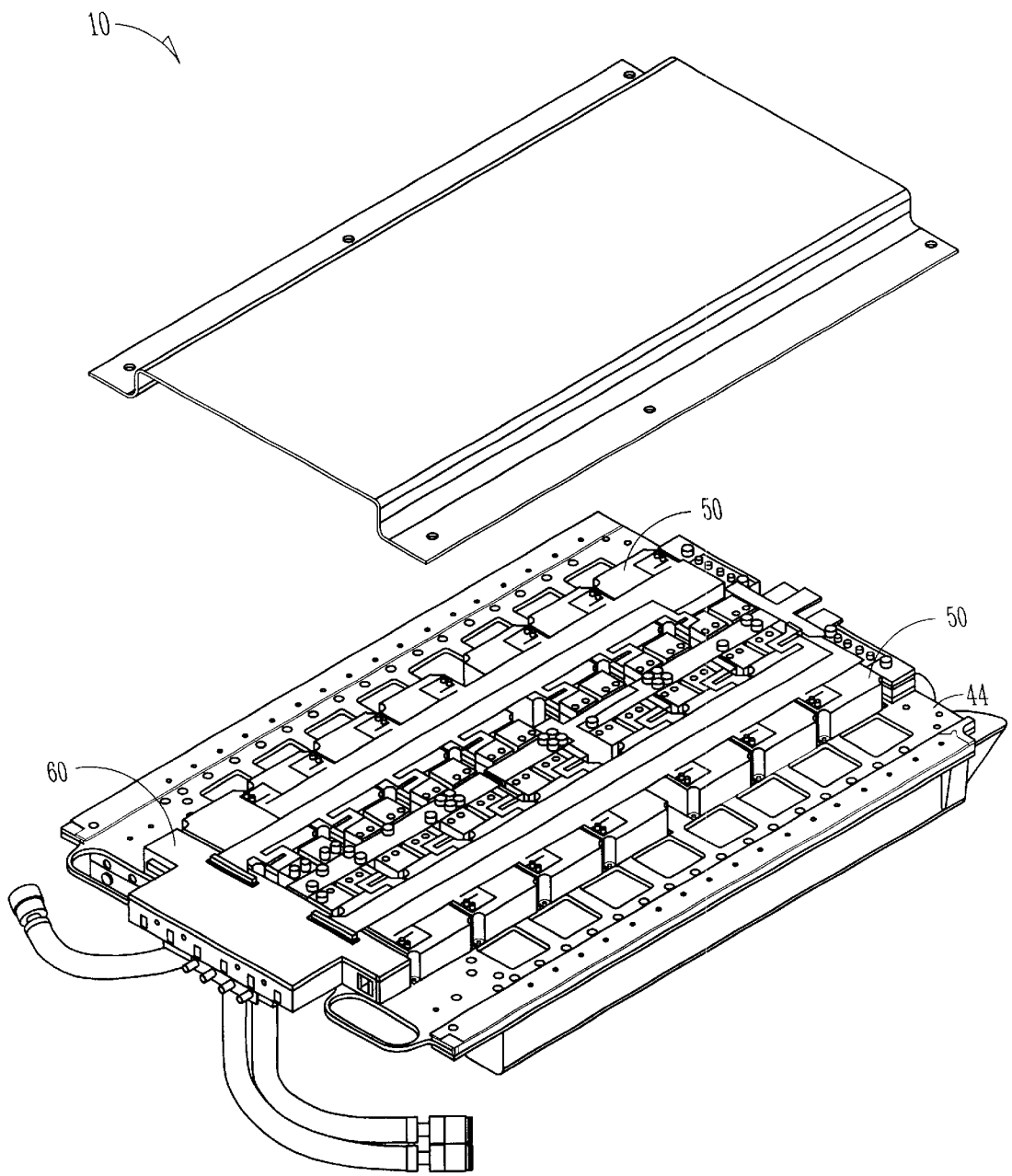
FIG. 4 illustrates a node module constructed in accordance with one embodiment.

Because of the high efficiency of these converters, in one embodiment they are conduction cooled with the same fluid that is use to spray evaporative cool each MCM module 22. Such an embodiment is shown in FIG. 4. In the module 10 of FIG. 4, a plurality of DC—DC converters 50 are mounted on a side of PCB 48 (FIG. 3) opposite MCM modules 22 (FIG. 3). Each converter 50 is placed in thermal contact with cold plate 44. Coolant fluid received at module 10 is distributed through channels within cold plate 44 in order to conductively cool converters 50 before that coolant is used to cool MCM modules 22.

One advantage of cooling the converters 50 before cooling MCM modules 22 is that heat from converters 50 is used to raise the temperature of the cooling fluid to a temperature near the fluid's boiling point. This increases the amount of fluid that vaporizes when it comes into contact with MCMs 26.

In one embodiment, converter 50's mean time between failure (MTBF) is greater than 1,000,000 hours and is designed to operate in a parallel, N+1 configuration, which makes a very reliable power supply assembly for the SV2 modules. The power density of the converter is greater than 16 W/in$^3$ and employs electronic inrush control, current shares, voltage margins, and has enable feature controls.

Spray Evaporative Cooling (SEC) was selected as one of the enabling technologies for this supercomputer because of its ability to efficiently and effectively cool high power density ASICs and its ability to minimize temperature variation between ASICs at different power levels. Spray Evaporative Cooling is a process where a fluid is sprayed onto the surface of a high power ASIC at a rate that maintains a continuously wetted surface. The fluid on the hot surface then absorbs the heat and evaporates, thus removing the heat from the surface of the high power ASIC. Spray Evaporative Cooling is used to maintain the junction temperatures of the ASICs on each MCM 26 between 70° and 85° C. The heat flux on these ASICs range from 15 W/cm$^2$ to 55 W/cm$^2$. In one embodiment, the cooling fluid used in this application is 3M's dielectric fluorocarbon, FC72. Its boiling temperature is 56° C. at 1 atmosphere pressure. The established flow rate requirement for the MCM design shown is approximately 1 ml/mW/min.

In one embodiment, system design and reliability considerations led to the choice of pressure-atomization (Pais, et al, 1989), rather than secondary-gas-assisted choice of pressure atomization for this application. In one such embodiment, the nozzle design used is a full cone pressure swirl chamber such as shown in FIG. 3 of "Atomization and Sprays" by A. H. Lefebvre, Taylor & Francis Publishing, 1989.

Figure 5:
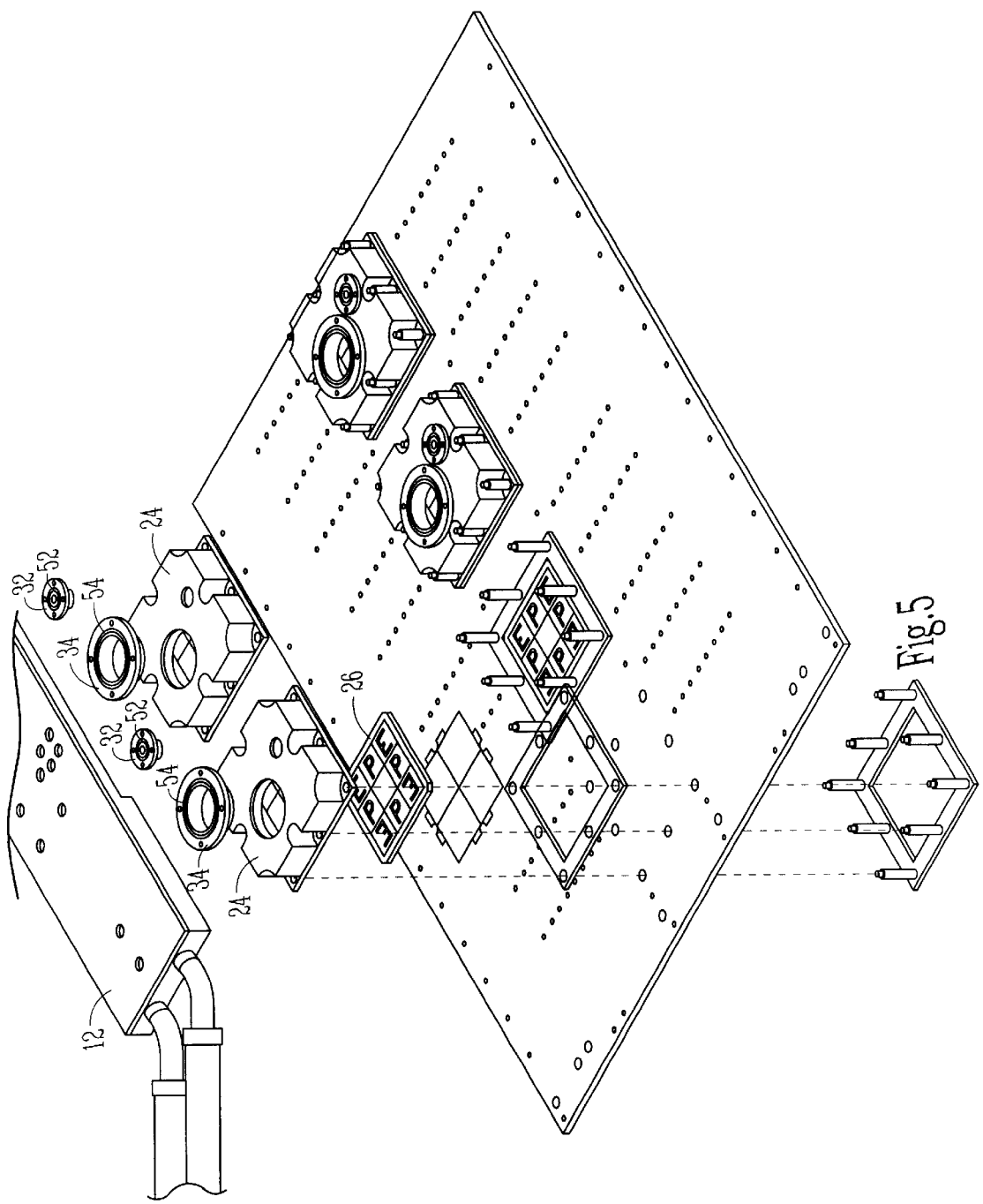
FIG. 5 illustrates a node module constructed in accordance with one embodiment.
Figure 6:
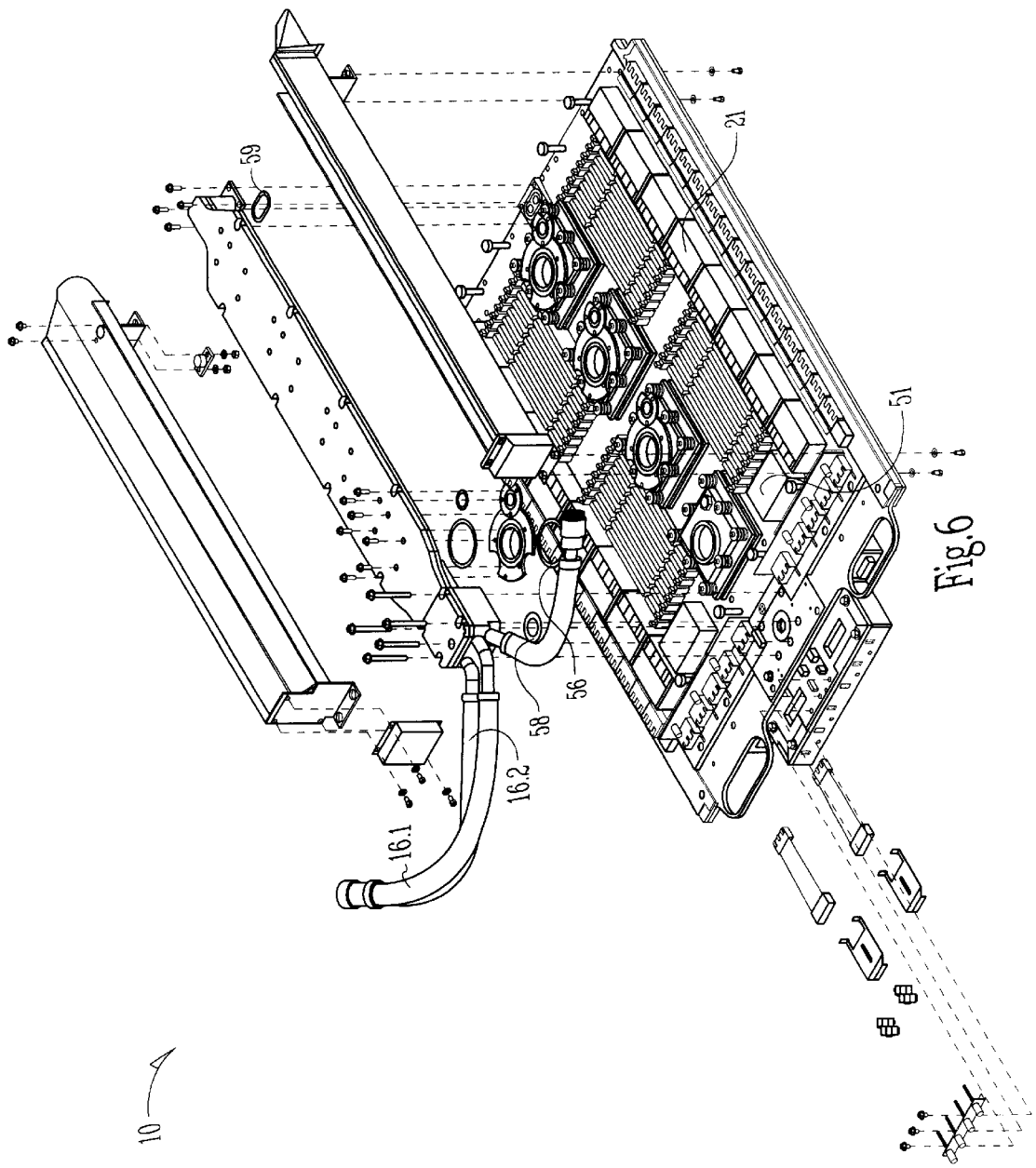
FIG. 6 illustrates a node module constructed in accordance with one embodiment.

In one embodiment, node module 10 is a single PCB assembly that is mounted onto an aluminum cold plate such as cold plate 44. Node module 10, in one option, includes four MSPs, each containing four processors and four cache chips mounted on an MCM 26. One example of such an MCM 26 is shown in FIG. 5. In the example shown in FIG. 5, "O" rings 52 and 54 seal module 12 to adapters 32 and 34, respectively. In addition, an "O" ring 56 can be used to seal adapter 32 and 34 to cap 24 as is shown in FIG. 6.

In one embodiment, the four MCM modules 22 are mounted in a row down the center of the PCB assembly as shown in FIG. 2. MCM modules 22 are mounted to the PCB using the cap assembly in the manner described earlier. A backing plate 38 is used to support the PCB against the load of the compliant interconnect systems that is providing the contact between MCMs 26 and PCB 48.

In one embodiment, local memory for the node module includes 32 daughter cards 20. In one such embodiment, such as is shown in FIG. 3, memory daughter cards 20 are mounted onto PCB 48 in four groups of eight cards. In the embodiment shown, two groups of the eight cards are mounted on each side of the MCMs.

As noted above, daughter cards 20 are cooled by forced convection with air. To meet the system's environmental requirements, in one embodiment a heat spreader was designed and placed on the TSOPs to enhance the heat transfer process. The thermal resistance of the heat spreader design is 16° C./W for air velocities of 1200 fpm. Molded covers are then placed over each of the two array of cards to channel the air that is being drawn in from the front of the module, through to the back where the air is then exhausted into the chassis return air plenum.

In one embodiment, such as is shown in FIG. 2, eight organic ball grid array (BGA) single chip modules (SCM) 21 are placed between the daughter cards 20 and two outside edges of PCB 48. Modules 21 support the functions of memory controller, network interfacing, cache coherence directories, and management of off module communication channels.

These off module communication channels are connected to other node or router modules via differential signal pair wires that are housed in thirty-two blind mate, cam actuated, controlled impedance edge connectors (refer to FIGS. 4 & 5). These 16 BGAs are air-cooled with reverse impingement heat sinks. These heat sink have a thermal resistances of 1.25° C./W.

In one embodiment, the molded cover that is used for directing air across the memory daughter cards 20 also channels 4 cfm of air individually through each of these heat sinks. The power level of the ICs and the associated caloric temperature rise of the air through the heat sink dictated this cooling approach. The air is channeled into the heat sinks over the edge connectors and is then drawn out through the rear of the module into the chassis return air plenum.

In one embodiment, each node module 10 has two I/O channel SCMs 51. Each I/O channel SCM 51 provides two IO channels. In one such embodiment, these SCMs are located on PCB 48 directly in front of memory daughter cards 20, as shown in FIG. 6. These two SCMs each have a heat sink mounted to them to dissipate their heat. In one embodiment, the air that is drawn across the memory daughter cards is first used for the cooling of these two SCMs.

In one embodiment, the DC power required by the ICs on module 10 is provided by 14 DC—DC synchronous power converters 50. The power converters are mounted on the top side of coldplate 44. Incoming power to the converters is provided, in one option, at 48 volts DC. This power is supplied to the converters via blind mate connectors that connect to the power distribution busses that are located in the chassis. In one embodiment, the input voltage is distributed to each of the converters via two laminated flexible bus bars. The output power bus from converters 50 is designed to enable the 1.8 volt converters (quantity of 11) and the 2.5 volt converters (quantity of 4) to operate independently in an N+1 configuration. The output power busses connect to module 10 via bus blocks that are soldered to voltage pads located on the bottom of PCB 48, and extend through an opening in coldplate 44.

As noted above, in one embodiment converters 50 are high efficiency converters which dissipate their heat losses via conduction to coldplate 44. Coldplate 44 is designed with internal passages to allow coolant to pass through and remove the dissipated heat from the power converters. Other mechanisms for placing the coolant in thermal contact with converters 50, such as a manifold, could also be used.

Referring again to FIG. 2, in one embodiment, the coolant is supplied to module 10 through a single stainless steel hose 14 that connects to a fluid distribution manifold on the chassis. The coolant flows through the hose assembly into an aluminum coldplate 44 that the PCB assembly is mounted onto. Coldplate 44 allows the coolant to flow through it from the front of module 10 to the rear. At the rear of module10, in one option, the fluid enters module distribution manifold 12 and is distributed to each of the four MCM modules 22.

In one embodiment, as is shown in FIG. 6, "O" ring 58 seals the connections between hose 14 and coldplate 44. In a similar manner, "O" ring 59 seals the connection between coldplate 44 and manifold 12.

When the coolant is sprayed onto the integrated circuits on MCM 26 (FIG. 1) and gone through a phase change it then exits module 10 through a pair of stainless steel hoses 16.1 and 16.2 to a return manifold on the chassis.

In one embodiment, such as is shown in FIG. 4, module controller 60 monitors the operating conditions of the components on module 10 and controls its operation based on this information.

The second module type in the SV2 supercomputer is a router module. The function of this module is to provide multiple independent interconnection networks for the MSPs on node module 10.

Figure 7:
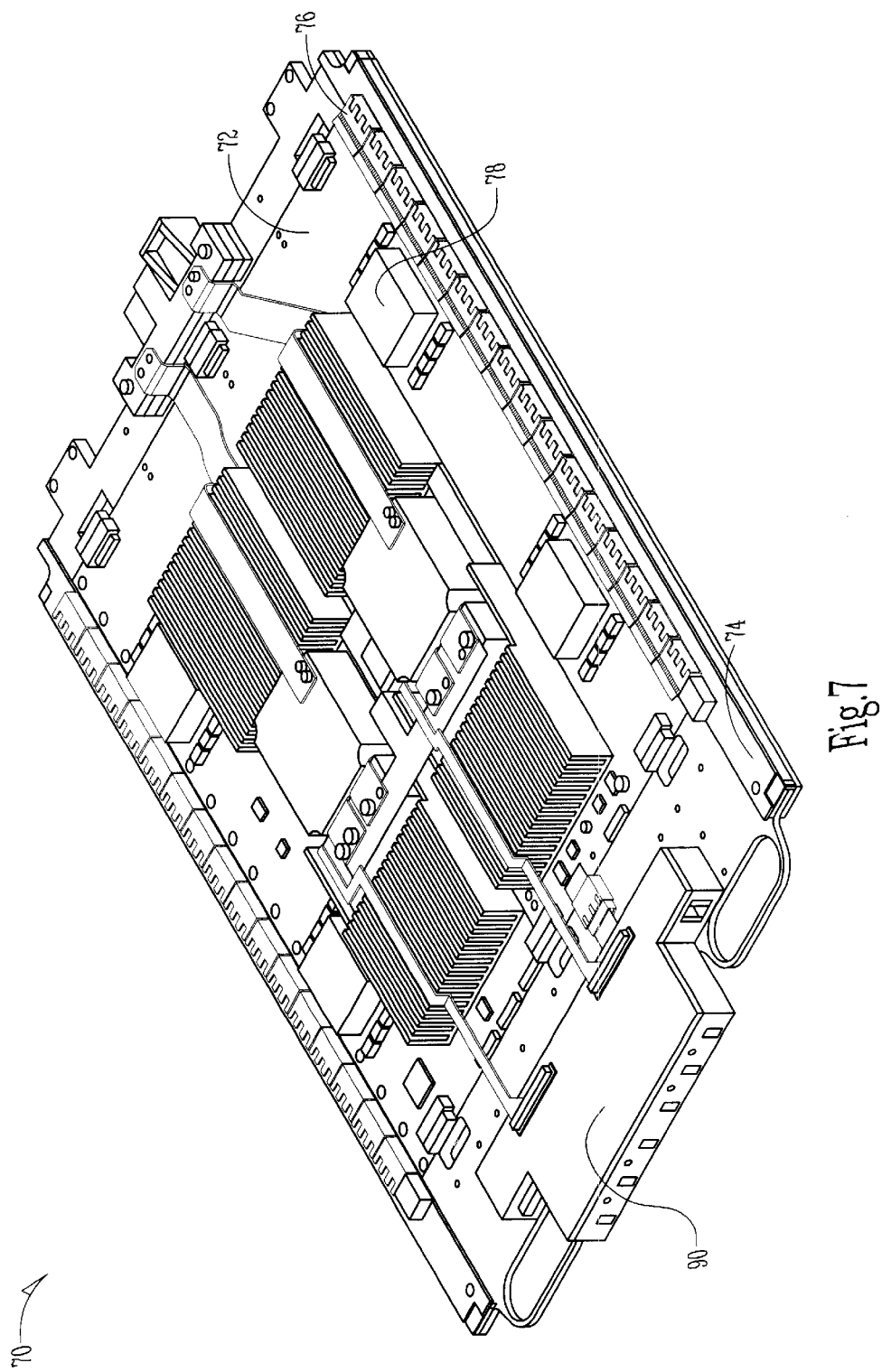
FIG. 7 illustrates a router module constructed in accordance with one embodiment.

In one embodiment, as is shown in FIG. 7, router module 70 includes two PCB assemblies 72 mounted on opposite sides of an aluminum coldplate 74. Each PCB assembly 72 includes, in one option, four router chips 78 mounted on the outside edge of the PCB next to the edge connectors. In one such embodiment, the router chips are air cooled in a similar fashion as the I chip on the node module.

Figure 8:
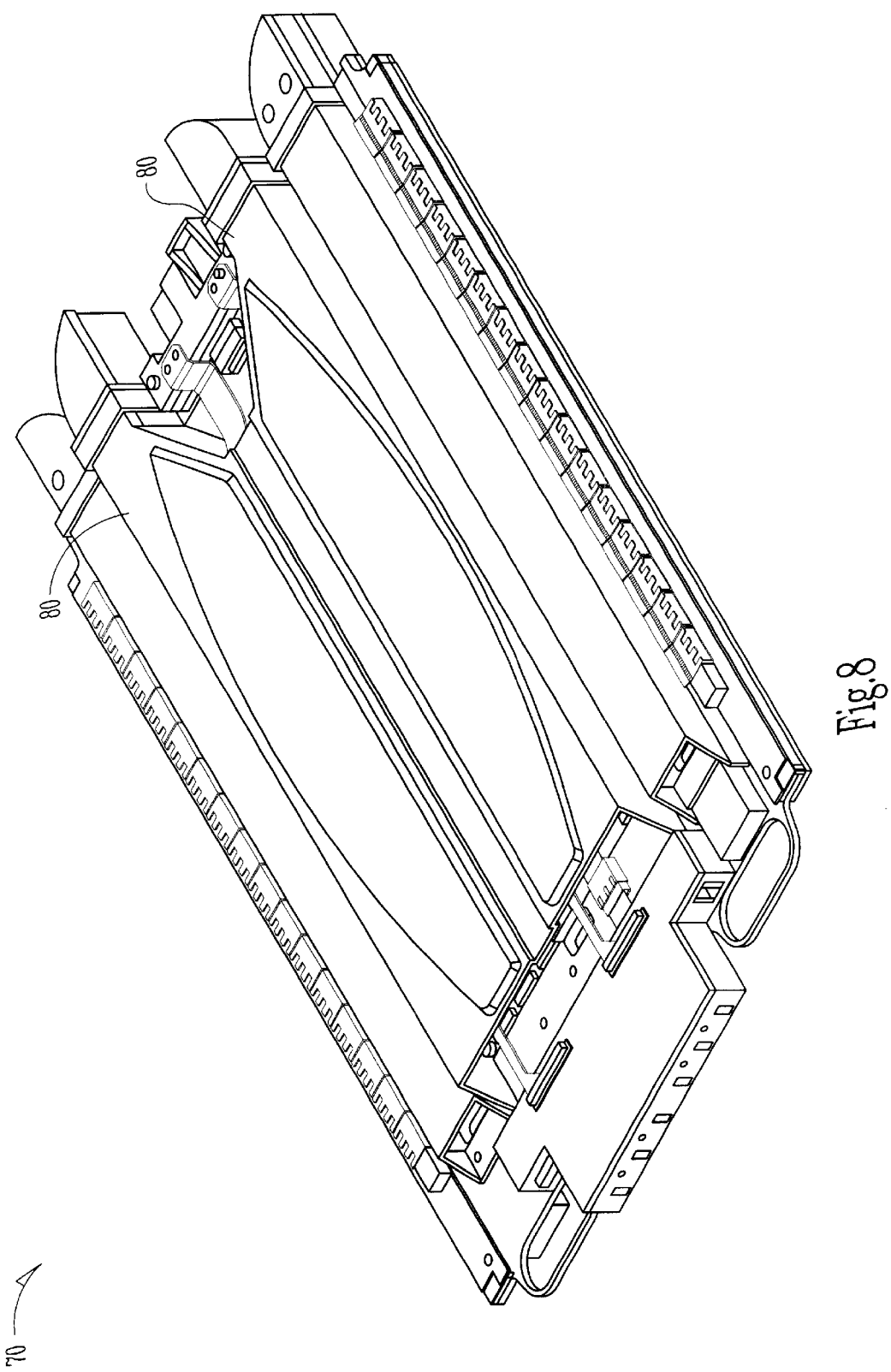
FIG. 8 illustrates a router module constructed in accordance with one embodiment.

In one embodiment, manifolds 80 (FIG. 8) are placed on module 70 to direct the air across the heat sinks and into the return air plenum in the chassis. In the center of the top side of the module are located two DC—DC power converters. These converters provide the power for the router chips on both of the PCB assemblies that are mounted to the same coldplate 74. These converters are mounted on air cooled heatsinks and cooled by force convection. A duct is again mounted over the heat sinks to direct the air. The 48 volt input power to the router module is provided in the same fashion as it was to node module 10.

In one embodiment, edge connectors 76 on router module 70 are identical to the edge connector 11 used on node module 10 (FIG. 1). In one such embodiment, the number of edge connectors per router PCB 72 is exactly the same as on node PCB 48. The router module, with its two PCB, has twice the quantity of edge connectors as node module 10 (FIG. 4).

In one embodiment, router module 70 also has a module controller 90 mounted on the top side of the module assembly. It performs a similar function for the router module as does controller 60 for node module 10 (FIG. 4).

Figure 9:
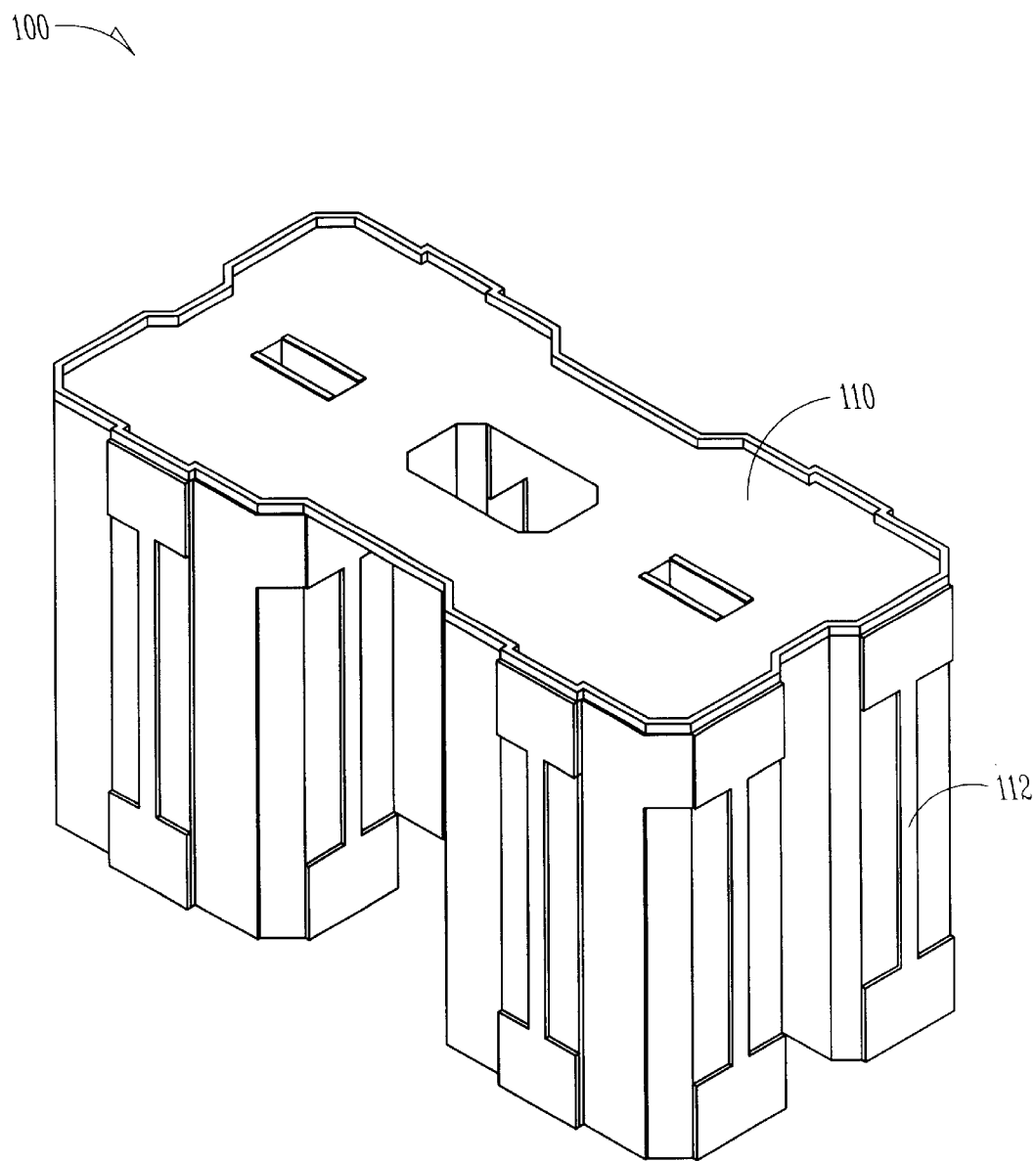
FIG. 9 illustrates a four chassis computer system constructed in accordance with one embodiment.

One embodiment of a four chassis, liquid-cooled supercomputer system 100 is shown in FIG. 9. In the configuration shown in FIG. 9, overhead cabling troughs 110 connect each of the four chassis 112.

Supercomputer system 100 can also be implemented as an air-cooled model. Both the air and liquid-cooled models use similar components as their building blocks. The basic difference between the two chassis types is that all of the heat generated by the air-cooled chassis is rejected to room air, where the liquid-cooled chassis rejects all of the heat it generates to facility water. The two chassis are both stand alone cabinets that don't require any additional mechanical, electrical, or environmental support equipment for its operation. It should be noted that the chassis configuration in FIG. 9 does not show any of the required system components, such as a input/output (IO) cabinet, disc drives, and etc., for communicating to and supporting the system.

Figure 10:
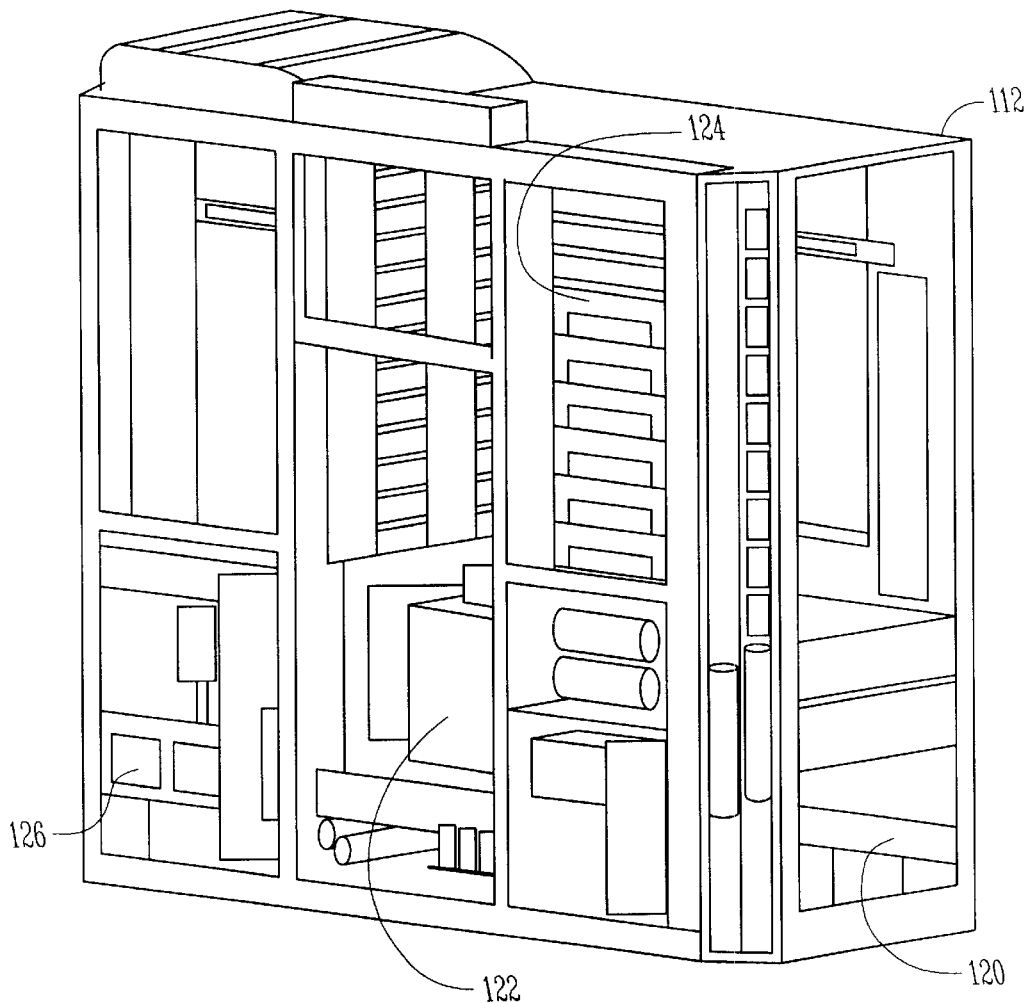
FIG. 10 illustrates a single chassis optionally used in the system of FIG. 9 constructed in accordance with one embodiment.

In one embodiment, each chassis 112 is designed to support sixteen node modules and eight router modules. In one such embodiment, chassis 112 is divided into four mechanical subsystems, of which each mechanical subsystem supports four node modules 10 and two router modules 70. Two mechanical subsystems are packaged into identical halves of the chassis assembly, as is shown in FIG. 10.

In one embodiment, each mechanical subsystem operates independently from other subsystems. A mechanical subsystem includes a brick cooling unit (BCU) 120, AC power components and power supplies, module cage, connector rails and cables, and a system controller. Besides the frame, the only component that the mechanical subsystems share is blower unit 122.

In one embodiment, the cabinet is a custom built frame that is constructed out of 6061 T6 aluminum. The liquid-cooled cabinet, with a full complement of modules 10 and 70, weighs approximately 1400 kg. In one embodiment, the cabinet is approximately 2.4 m long, 0.9 m wide and 2.1 m tall. The cabinet consumes approximately 90 kW of AC power.

System Interconnect

In one embodiment, a module card cage 124 is located on each side of chassis 112. Card cage 124 provides a mounting location for modules 10 and 70 in the chassis for aligning them to the system cable and power connectors.

In one embodiment, each card cage assembly contains eight node modules 10 that are located in the bottom eight rails locations. The top four rail locations are where the router modules are placed. The communication between the modules is provided with three separate cable types, a flex cable, a ribbon cable, and a shielded twisted wire pair cable. The flex cable is used for all interconnections lengths that do not exceed 36 cm, the ribbon cable for lengths less than 1.2 m, and the shielded cable for all lengths that exceed 1.2 m.

Cabling between the sections in a cabinet are routed through the top of the cabinet. Cabling that occurs between cabinets is routed up through the top of the cabinets to cabling trough 110. This technique for cabling multiple cabinets together can also be used to cable to an IO cabinet.

In one embodiment, chassis 112 operates with a supply voltage between 180 and 263 volts AC, at either 50 or 60 Hz power. The chassis requires four 100 amp, 3 phase, 4 or 5 wire power cords (depends on site location) for operation. The AC power cords are fed into an AC power box that is located in the lower sections in the side of the chassis (refer to FIG. 10).

In one such embodiment, power box 126 contains AC filters, breakers, terminal blocks, and controls. The power from AC power 126 box is fed directly to the AC power supplies that are located directly below the module card cages. The power supplies convert the AC power to 48 volt DC, which is then bused up the inside of the chassis to the module locations. The 48 volt DC power is connected to the module upon insertion into the chassis via a blind-mate power connector located on the back of the module. The 48 volt DC is then distributed to the DC power converters on the module via a copper laminated bus.

As noted above, two distinct methods of cooling are used in the SV2 supercomputer for thermal management. Force convection air cooling is used for the low power ICs, such as the memory ICs, all SCM packages, and the miscellaneous discretes and SEC for the high power components that are mounted on MCM 26.

In one embodiment, force convection air flow required in the cabinet is supplied by a central centrifugal blower 122 as shown in FIG. 10. The blower is capable of moving 4000 CFM throughout the air distribution system within chassis 112. The air used for forced convection cooling is recirculated within the system. The reason for this approach is to eliminate any computer room air distribution problems when more than one cabinet system is placed within the same computer room.

Figure 11:
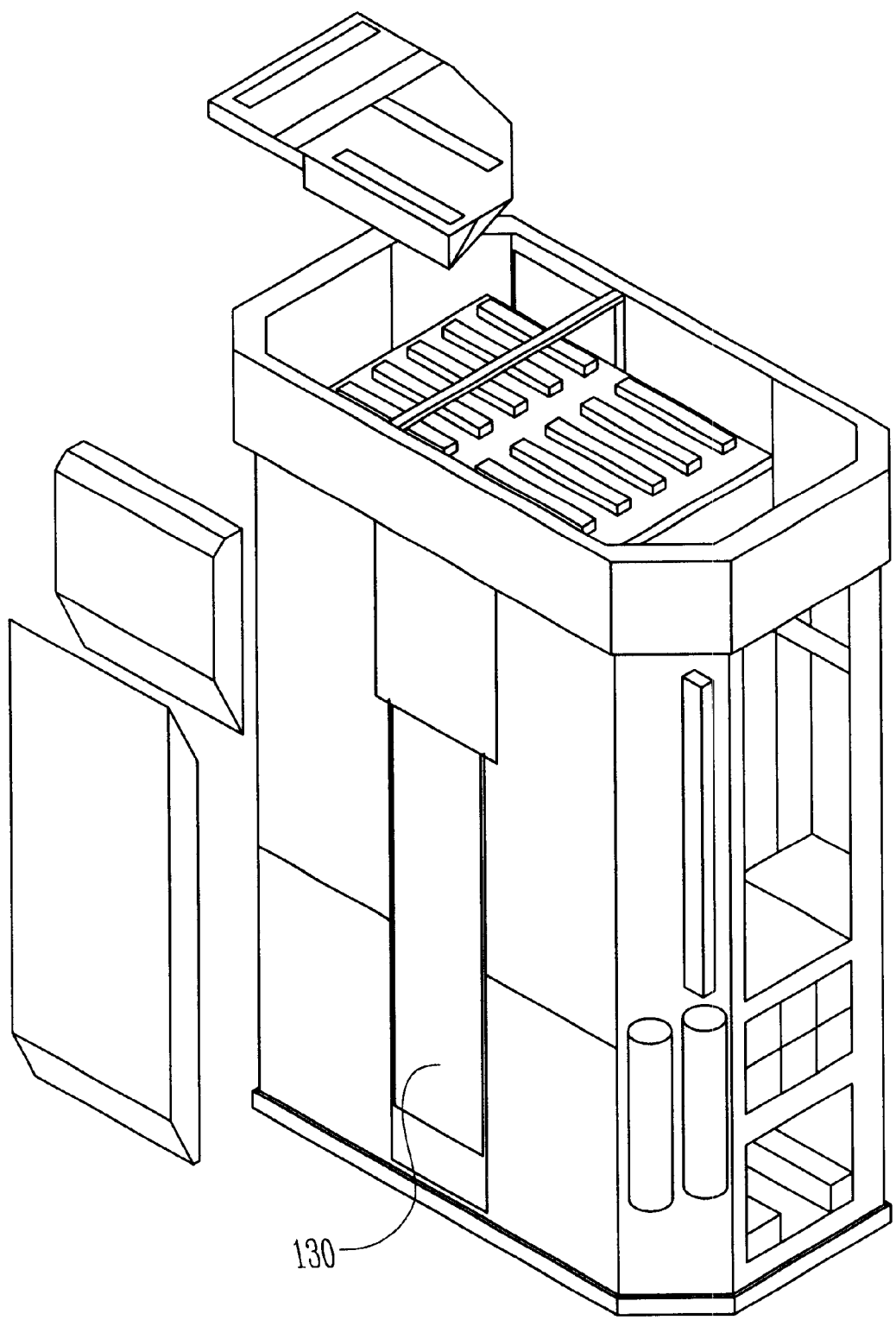
FIG. 11 illustrates air cooling and I/O connections in a system such as is shown in FIG. 10 constructed in accordance with one embodiment.

The centrifugal blower pushes the warm air returning from the modules, at approximately 45° C., through water cooled tube-and-fin heat exchangers 130 (refer to FIG. 11) mounted on both sides of the cabinet. The air exits heat exchangers 130 chilled to a temperature of approximately 30° C. The air is then directed up the sides of the chassis to air plenums at the top of the cabinet. The air plenums direct the air to the front of the sides of the cabinet. The air is then directed down to the front of the modules where the module ducts (covers) funnel the air across the component heatsinks and into the return air plenum located directly above central blower 122.

In FIG. 10 the module air vents are shown located on the card cage back plate. These vents are opened upon insertion of the module into the chassis. In one embodiment, when a module is not seated into a slot the vent door is closed, the vent door simulates the pressure drop through the module so that the air distribution will not be affected if a module is not present.

Figure 12:
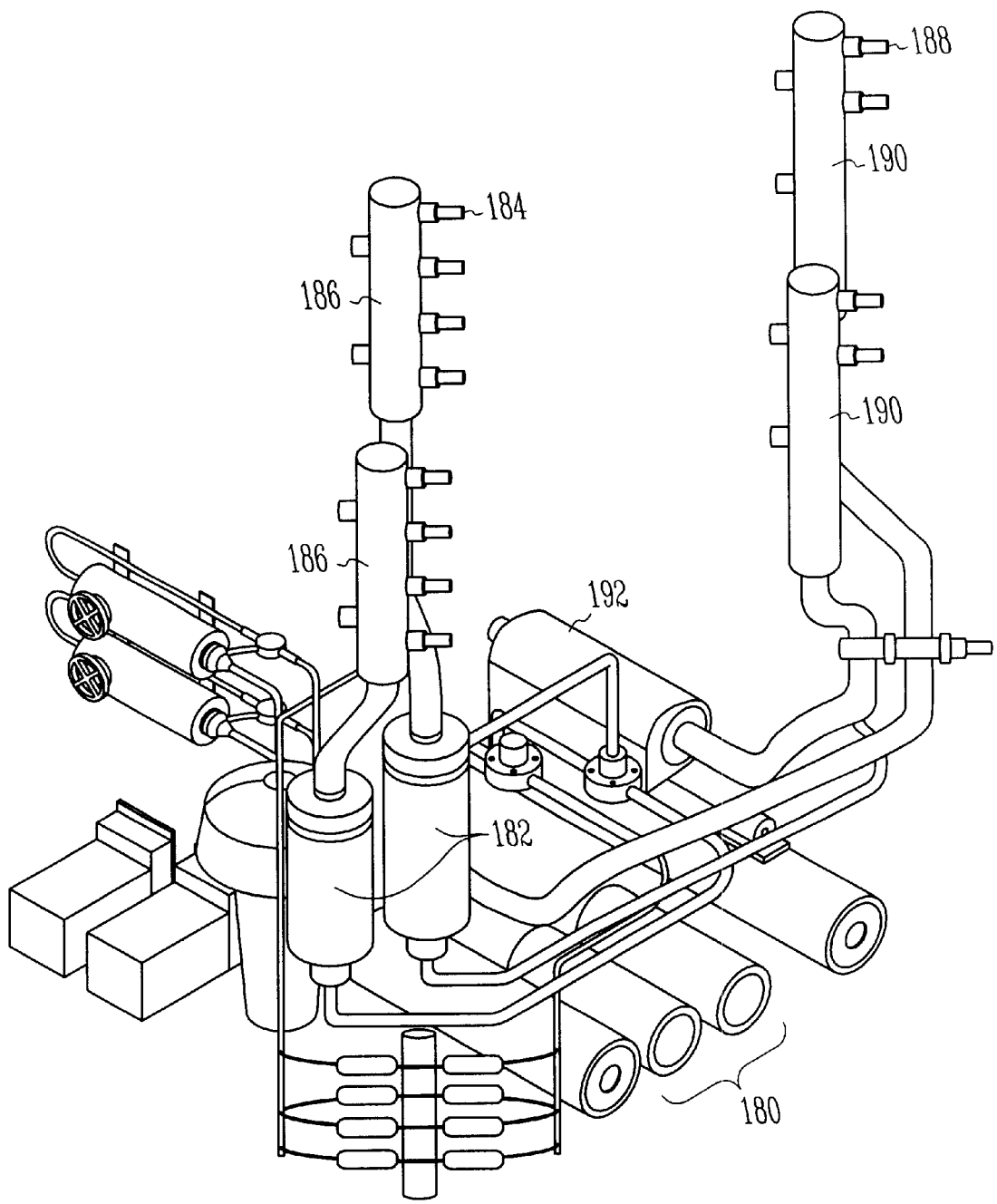
FIG. 12 illustrates a cooling unit which can be used to cool a liquid coolant constructed in accordance with one embodiment.
Figure 13:
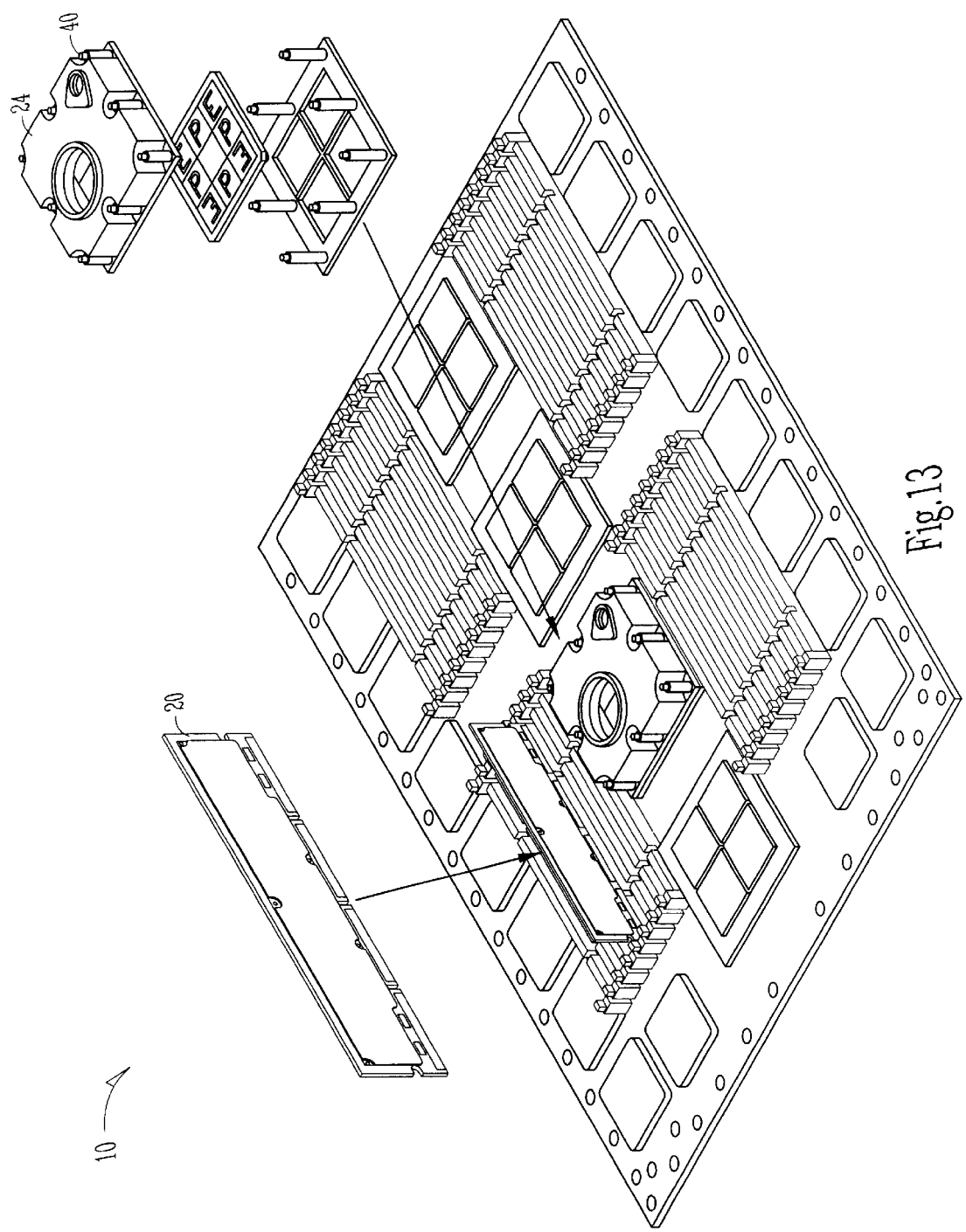
FIG. 13 illustrates a spray cap constructed in accordance with one embodiment.

The brick cooling units depicted in FIG. 12, are used to provide and condition the fluid that is required for the spray evaporative cooling of the components on the MCM modules 22. In one embodiment, the BCU is a semihermetic cooling system that is constructed with stainless steel and aluminum components. The fluid pump 180 is a magnetically coupled gear pump that is capable of supplying 20 liters/min of FC72 at 35 psid to node modules 10. The fluid passes through a particulate filter 182 as it exits the pump 180 and then through stainless tubing to the supply manifolds 186. The fluid then passes to node module 10 from the manifold 186 through quick disconnect couplings 184 that are used for mating the module hose to the chassis manifold.

In one embodiment, as the mixed phase fluid exits the node module it passes through a pair of hoses and quick disconnect couplings 188 before it passes into the chassis return manifolds 190. From the return manifold 190 the mixed phase fluid enters into the heat exchanger 192, where the fluid is separated, condensed, and subcooled before it returns to the gear pump to complete the circulation loop.

In conjunction with the main circulation loop, the system has a bypass circuit to insure the continued condition of the fluid. The bypass circuit has filters that continually remove organics, moisture, particulates, and any perfluoroisobutylenes (PFIB) that may be generated in the system due to the breakdown of the cooling fluid, Fluorinert (FC72). The cooling system has indicators imbedded in the cooling loop that indicate the condition of the fluid and when the filters need to be replaced. The bypass filters can be replaced while the system is running.

In one embodiment, each computer system has a System Work Station (SWS). The SWS is a computer that holds the boot code required to bring up the system and also provides a user interface for monitoring of the system's status and controlling its operation. The SWS communicates to the system hardware via an ethernet connection to a System Controller (L1). There are L1 controllers for each module 10 and 70 in the chassis and on each BCU. The L1 performs multiple functions which include the warning and control for system operation, JTAG, boundary scan, configuration management, maintenance, and remote support access.

In one embodiment, the L1 controller is a custom designed microprocessor with external SDRAM, FLASH, NVRAM and a 100Base-T ethernet port. The L1 also contains a micro controller (L0), which provides environmental monitoring and protection for the system. The L0 is a 16-bit micro controller that reads signals from various system sensors and controls the power and cooling systems. Environmental status of the system (voltages, temperatures, pressures, etc.) can be monitored from the SWS. The L1s are powered from the chassis's main input power source, allowing the controller to be accessed without the mainframe operating.

In one embodiment, the control system is designed to allow each module to operate independently of the other modules. If a module needs to be replaced or repaired it can be removed without bringing down other modules in the system.

In another embodiment, a method of cooling an enclosure is described. The method, in one option, incorporates the above-described structure therein. A method of cooling an electronics enclosure is provided in another embodiment. The method includes forcing air over a first set of electronic components and cooling the first set of electronic components, heating a liquid to a temperature near its boiling point, directing the heated liquid against a second set of electronic components where at least portion of the heated liquid vaporizes, drawing the vapor and the heated liquid away from the electronics components, condensing the vapor back into liquid, and cooling the air and recirculating the air through the enclosure, where the air is maintained within the enclosure in a closed system.

Several options for the method are as follows. For example, in one option, the method further includes recirculating the liquid, where the liquid and vapor are maintained within the enclosure in a closed system. In another option, the method further includes filtering the liquid, or charging the liquid with a non-corrosive gas. In another option, directing the heated liquid against the second set of electronic components includes directing the heated liquid against electronic components having a higher power than the first set of electronic components.

In yet another embodiment, a method of cooling an electronics enclosure having a plurality of electronics components includes directing a gas over electronic components and cooling the first set of electronic components, cooling the gas within the electronics enclosure, and recirculating the gas within the enclosure, where the air is maintained within the enclosure in a closed system.

Several options for the method are as follows. For instance, in one embodiment, cooling the gas includes passing the gas through a water cooled heat exchanger. Optionally, recirculating the gas includes directing the gas up sides of the enclosure to air plenums at the top of the enclosure. The method further optionally includes funneling the gas across heatsinks thermally coupled with the electronic components.

In the above discussion and in the attached appendices, the term "computer" is defined to include any digital or analog data processing unit. Examples include any personal computer, workstation, set top box, mainframe, server, supercomputer, laptop or personal digital assistant capable of embodying the inventions described herein.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. An enclosure, comprising:
   a plurality of a first set of electronic components;
   cooling means for cooling a gas;
   distribution means for directing the gas across the electronics components and the cooling means;
   wherein the distribution means forms a closed system limiting the transfer of the gas both into and out of the distribution means;
   a second set of electronic components; and
   means for spray evaporative cooling the second set of electronic components.

2. The enclosure according to claim 1, wherein the cooling means includes a heat exchanger and means for directing water through the heat exchanger.

3. The enclosure according to claim 1, further comprising means for distributing fluid through the means for spray evaporative cooling, wherein the means for distributing fluid through the means for spray evaporative cooling forms a closed system.

4. The enclosure according to claim 3, wherein the first set of electronic components are low power components and the second set of electronic components are high power components.

5. A system comprising:
   a chassis including one or more mechanical subsystems therein, each of the one or more mechanical subsystems including modules having a plurality of electronic components therein;
   a gas distribution member positioned within the chassis, the gas distribution member configured to direct a chilled gas toward the electronic components;
   a gas cooling device positioned within the chassis, the gas cooling device configured to cool the gas after the gas has been heated by the electronic components;
   a second set of electronic components within at least one of modules; and
   wherein at least one of the mechanical subsystems includes a fluid conditioning unit and at least one of modules includes a spray evaporative cooling assembly coupled to the fluid conditioning unit for cooling the second set of electronic components.

6. The system as recited in claim 5, wherein the at least one fluid conditioning unit and the spray evaporative cooling assembly form a closed system.

7. The system as recited in claim 6, wherein each module in the mechanical subsystem includes a spray evaporative cooling assembly, the fluid conditioning unit being coupled to each spray evaporative cooling assembly in the mechanical subsystem.

8. The system as recited in claim 5, wherein the gas cooling device includes a heat exchanger.

9. A system comprising:
   a chassis including one or more modules, at least one of the modules including a first set of electronic components and a second set of electronic components;
   at least one of the modules including at least one spray evaporative cooling assembly that is thermally coupled to the first set of electronic components;
   a gas distribution member positioned within the chassis, the gas distribution member configured to direct a chilled gas toward the second set of electronic components; and
   a gas cooling device positioned within the chassis, the gas cooling device configured to cool the gas after the gas has been heated by the second set of electronic components.

10. The system as recited in claim 9, further comprising at least one fluid conditioning unit such that the at least one spray evaporative cooling assembly and the at least one fluid conditioning unit form a closed system.

11. The system as recited in claim 10, wherein the gas distribution member and the gas cooling device form a closed system.

12. The system as recited in claim 9, wherein the at least one fluid conditioning unit includes at least one pump and a heat exchanger.

13. The system as recited in claim 9, wherein the spray evaporative cooling assembly includes a fluid charged with a non-corrosive, inert gas.

14. The system as recited in claim 13, wherein gas is Nitrogen.

15. A method of cooling an electronics enclosure having a plurality of electronics components, comprising:
   forcing air over a first set of electronic components and cooling the first set of electronic components;
   heating a liquid to a temperature near its boiling point;
   directing the heated liquid against a second set of electronic components where at least portion of the heated liquid vaporizes;
   drawing the vapor and the heated liquid away from the electronics components; and
   condensing the vapor back into liquid; and
   cooling the air and recirculating the air through the enclosure, where the air is maintained within the enclosure in a closed system.

16. The method as recited in claim 15, further comprising recirculating the liquid, where the liquid and vapor are maintained within the enclosure in a closed system.

17. The method as recited in claim 16, further comprising filtering the liquid.

18. The method as recited in claim 15, further comprising charging the liquid with a non-corrosive gas.

19. The method as recited in claim 15, wherein directing the heated liquid against the second set of electronic components includes directing the heated liquid against electronic components having a higher power than the first set of electronic components.

20. A method of cooling an electronics enclosure having a plurality of electronics components, comprising:
   directing a gas over a first set of electronic components to cool the first set of electronic components;
   cooling the gas within the electronics enclosure; and
   recirculating the gas within the enclosure, where the air is maintained within the enclosure in a closed system;
   directing a liquid against a second set of electronic components where at least portion of the heated liquid vaporizes; and
   drawing the vapor and the heated liquid away from the electronics components.

21. The method as recited in claim 20, wherein cooling the gas includes passing the gas through a water cooled heat exchanger.

22. The method as recited in claim 20, wherein recirculating the gas includes directing the gas up sides of the enclosure to air plenums at the top of the enclosure.

23. The method as recited in claim 20, further comprising funneling the gas across heat sinks thermally coupled with the electronic components.

24. A cooling assembly comprising:

a substrate;

an electronic component;

a compliant interconnect assembly that includes a spray evaporative cooling assembly thermally coupled with the electronic component, the compliant interconnect assembly compressing the electronic component against the substrate; and cooling fluid within the spray evaporative cooling assembly, the spray evaporative cooling assembly configured to direct the cooling fluid against the electronic component.

25. The cooling assembly as recited in claim 24, wherein the compliant interconnect assembly includes a backer plate positioned on an opposite side of the substrate to the electronic component, the backer plate including posts, the posts on the backer plate extending through the substrate and a cap that includes the spray evaporative cooling assembly.

26. A method of cooling an electronics enclosure, comprising:

coupling an electronic component to a substrate using a compliant interconnect assembly that includes a spray evaporative cooling assembly;

disposing a liquid within the spray evaporative cooling assembly;

directing the liquid against the electronic component such that a portion of the liquid vaporizes; and drawing the vapor and the liquid away from the electronic components.

27. The method according to claim 26, wherein coupling an electronic component to a substrate using a compliant interconnect assembly that includes a spray evaporative cooling assembly includes compressing the electronic component against the substrate.

28. The method according to claim 26, further comprising heating the liquid to a temperature near its boiling point before directing the liquid against the electronic component.

* * * * *